(12) United States Patent
Han (10) Patent No.: US 9,147,746 B2
(45) Date of Patent: Sep. 29, 2015

(54) MOS TRANSISTORS AND FABRICATION METHOD THEREOF

(71) Applicant: Semiconductor Manufacturing International (Shanghai) Corporation, Shanghai (CN)

(72) Inventor: Qiuhua Han, Shanghai (CN)

(73) Assignee: SEMICONDUCTOR MANUFACTURING INTERNATIONAL (SHANGHAI) CORPORATION, Shanghai (CN)

( * ) Notice: Subject to any disclaimer, the term of this patent is extended or adjusted under 35 U.S.C. 154(b) by 0 days.

(21) Appl. No.: 14/070,645

(22) Filed: Nov. 4, 2013

(65) Prior Publication Data

US 2015/0035083 A1 Feb. 5, 2015

(30) Foreign Application Priority Data

Aug. 5, 2013 (CN) .......................... 2013 1 0338366

(51) Int. Cl.

| H01L 29/78 | (2006.01) |
|---|---|
| H01L 21/768 | (2006.01) |
| H01L 29/66 | (2006.01) |
| H01L 29/49 | (2006.01) |
| H01L 29/51 | (2006.01) |
| H01L 29/165 | (2006.01) |

(52) U.S. Cl.
CPC ........ *H01L 29/665* (2013.01); *H01L 21/76877* (2013.01); *H01L 29/6653* (2013.01); *H01L 29/66636* (2013.01); *H01L 29/66659* (2013.01); *H01L 29/165* (2013.01); *H01L 29/495* (2013.01); *H01L 29/517* (2013.01)

(58) Field of Classification Search
None
See application file for complete search history.

(56) References Cited

U.S. PATENT DOCUMENTS

| 7,598,542 | B2 * | 10/2009 | Gyun ............................ 257/206 |
|---|---|---|---|
| 7,768,038 | B2 * | 8/2010 | Cleeves ........................ 257/211 |
| 8,114,730 | B2 * | 2/2012 | Yoo et al. ...................... 438/230 |
| 2008/0061386 | A1 * | 3/2008 | Taguwa ......................... 257/412 |
| 2008/0230917 | A1 * | 9/2008 | Chou et al. .................... 257/774 |
| 2008/0311711 | A1 * | 12/2008 | Hampp et al. ................ 438/197 |
| 2012/0025266 | A1 * | 2/2012 | Griebenow et al. ........... 257/190 |
| 2013/0009244 | A1 * | 1/2013 | Zhu et al. ...................... 257/347 |

OTHER PUBLICATIONS

Lei et al, "Advantage of SiCoNi—TM Preclean over Wet Clean for Pre Salicide Applications Beyond 65nm Node", IEEE 2006.*

* cited by examiner

*Primary Examiner* — Johannes P Mondt
(74) *Attorney, Agent, or Firm* — Anova Law Group, PLLC (57) ABSTRACT

A method is provided for fabricating an MOS transistor. The method includes providing a semiconductor substrate; forming a metal gate structure; and forming a source region and a drain region. The method also includes forming a contact-etch-stop layer; forming an interlayer dielectric layer on the contact-etch-stop layer and the metal gate structure; and forming a first opening in the interlayer dielectric layer with a portion of the sidewall spacer and the contact-etch-stop layer left on the bottom. Further, forming a first contact hole in the interlayer dielectric layer by removing the portion of the sidewall spacer and the contact-etch-stop layer. Further, the method also includes forming a first conductive via in the first contact hole.

13 Claims, 6 Drawing Sheets

MOS TRANSISTORS AND FABRICATION METHOD THEREOF

CROSS-REFERENCES TO RELATED APPLICATIONS

This application claims the priority of Chinese patent application No. 201310338366.5, filed on Aug. 5, 2013, the entirety of which is incorporated herein by reference.

FIELD OF THE INVENTION

The present invention generally relates to the field of semiconductor manufacturing technology and, more particularly, relates to MOS transistors and fabrication techniques thereof.

BACKGROUND

With the development of integrated circuit (IC) technology, the integration degree of semiconductor devices has been consistently increasing, and the size of the semiconductor devices has become smaller and smaller. In order to lower the parasitic capacitances of the gate of MOS transistors and increase the device speed, high-K metal gate (HKMG) structures have been introduced in the MOS transistors. Conductive vias may often be used in the MOS transistors to form electrical interconnection structures. The conductive vias may usually be formed in source regions, drain regions and/or the surfaces of the HKMG structures. However, the size of the conductive vias may be difficult to further decrease because of process limitations, which may limit further size decreasing of the source regions, the drain regions, and the HKMG structures. Therefore, the integration degree of semiconductor devices may be unable to continuously increase.

In order to increase the integration degree, a shared via structure, i.e., the drain region and the HKMG structure share a same conductive via, has been developed. The shared via structure may reduce the size of the drain region and the HKMG structure.

FIGS. 1~5 show semiconductor structures corresponding to certain stages of an existing fabrication process for forming an MOS transistor with a shared conductive via structure.

Figure 1:
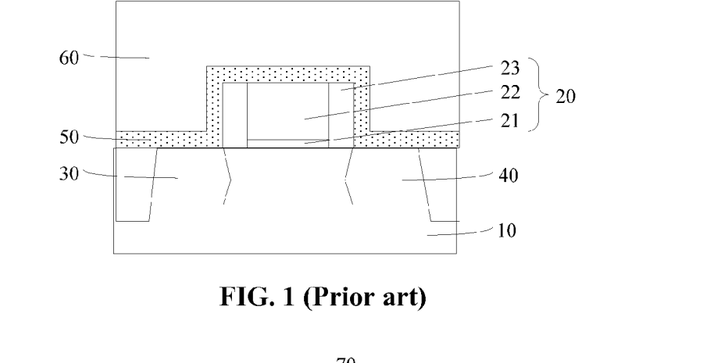
FIGS. 1~5 illustrate semiconductor structures corresponding certain stages of an existing fabrication process of an MOS transistor with a shared conductive via structure.

As shown in FIG. 1, a semiconductor substrate 10 is provided, and an HKMG structure 20 sequentially having a gate dielectric layer 21, a metal gate 22, and a sidewall 23 is formed on the semiconductor substrate 10. Further, a source region 30 and a drain region 40 are formed in the semiconductor substrate 10 at both sides of the HKMG structure 20. Further, a contact-hole-etch-stop layer 50 may be formed on the surface of the source region 30, the surface of the drain region 40 and the surface of the HKMG structure 20. Further, an interlayer dielectric layer 60 may be formed on the contact-hole-etch stop layer 50.

When the metal gate 22 is formed, because the metal may unlikely to avoid oxygen in the air, a metal oxide layer may be formed on the top of the metal gate 22 (not shown). The metal oxide layer may need to be removed before subsequently forming a conductive via.

Figure 2:
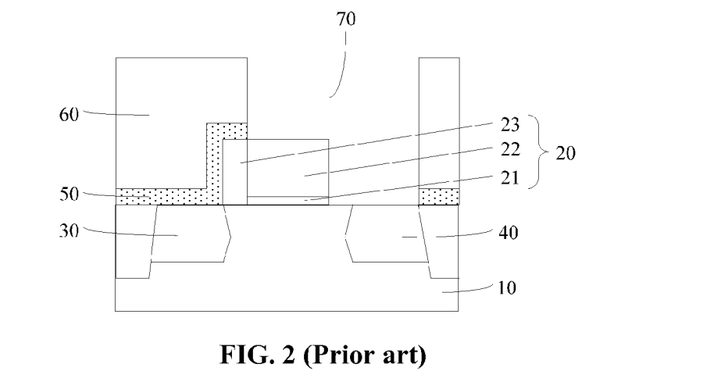

Further, as shown in FIG. 2, a first contact hole 70 may be formed by etching the interlayer dielectric layer 60 and the contact-hole-etch-stop layer 50.

Figure 3:
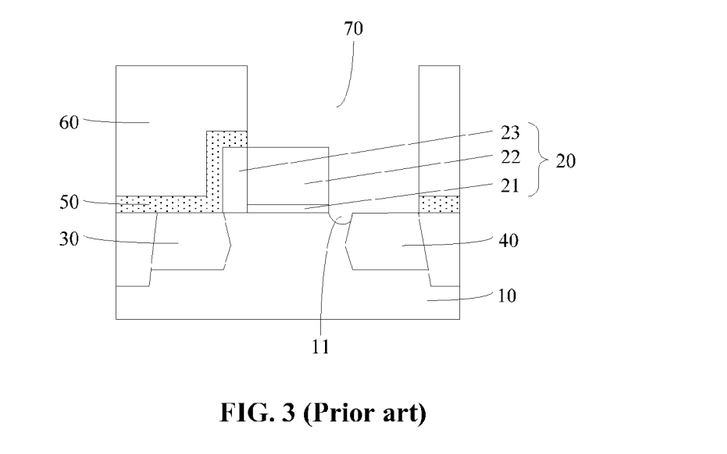

Further, as shown in FIG. 3, the metal oxide layer (not shown) on the top of the metal gate 22 may be removed by an argon sputter process. Because a metal silicide layer (not shown) may be formed on the drain region 40; and the metal silicide layer may protect the drain region 40 during the argon ion sputter process. Therefore, after removing the metal oxide layer by the argon sputter process, a portion of the semiconductors substrate 10 at the bottom of the HKMG structure 20 may be removed, and a depression 11 may be formed.

Figure 4:
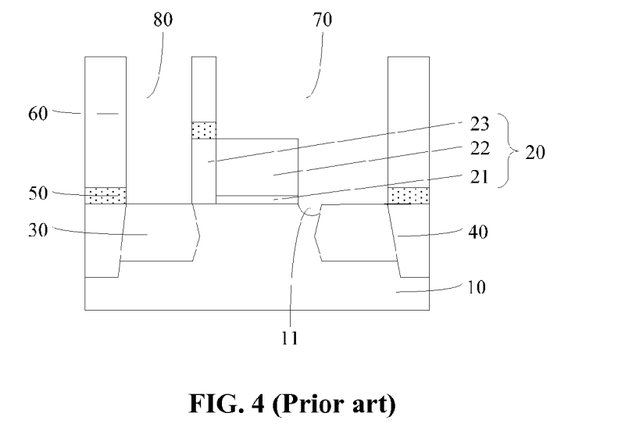

Further, as shown in FIG. 4, a second contact hole 80 may be formed by etching the interlayer dielectric layer 60 and the contact-hole-etch-stop layer 50.

Figure 5:
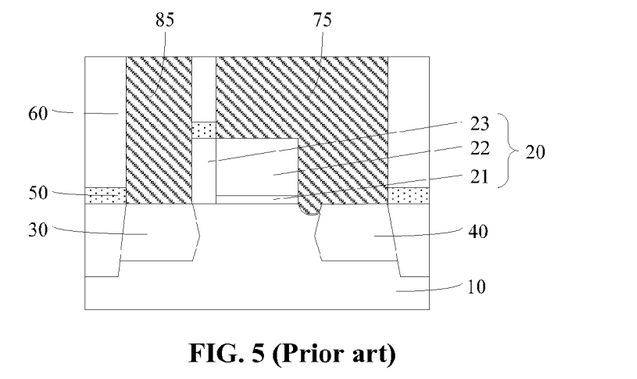

Further, as shown in FIG. 5, a first conductive via 75 and a second conductive via 85 may be formed in the first contact hole 70 and the second contact hole 80, respectively, by filling the first hole 70 and the second hole 80 with a metal material. The first conductive via 75 is a shared via shared by the metal gate 22 and the drain region 40.

Referring to FIGS. 4-5, because the first conductive via 75 may penetrate into the semiconductor substrate 10 because of the existing of the depression 11, the distance between the source region 30 and the drain region 40 may be reduced, and it may be easy to generate a leakage current. Thus, the MOS transistor formed by the existing method may have a relatively large leakage current. The disclosed device structures and methods are directed to solve one or more problems set forth above and other problems.

BRIEF SUMMARY OF THE DISCLOSURE

One aspect of the present disclosure includes a method for fabricating an MOS transistor. The method includes providing a semiconductor substrate; forming a metal gate structure; and forming a source region and a drain region. The method also includes forming a contact-etch-stop layer; forming an interlayer dielectric layer on the contact-etch-stop layer and the gate structure; and forming a first opening in the interlayer dielectric layer with a portion of the sidewall spacer and the contact-etch-stop layer left on the bottom. Further, the method includes forming a first contact hole in the interlayer dielectric layer by removing the portion of the sidewall spacer and the contact-etch-stop layer. Further, the method also includes forming a first conductive via in the first contact hole.

Another aspect of the present disclosure includes an MOS transistor. The MOS transistor includes a semiconductor substrate, a source region, a drain region and shallow trench isolation structures in the semiconductor substrate. The MOS transistor also includes a high-K metal gate structure, a contact-etching-stop layer and an interlayer dielectric layer on the semiconductor substrate. Further, the MOS transistor includes a first conductive via connecting with both the high-K metal gate structure and the drain region in the interlayer dielectric layer, and a second conductive via connecting with the source region in the interlayer dielectric layer.

Other aspects of the present disclosure can be understood by those skilled in the art in light of the description, the claims, and the drawings of the present disclosure.

DETAILED DESCRIPTION

Reference will now be made in detail to exemplary embodiments of the invention, which are illustrated in the accompanying drawings. Wherever possible, the same reference numbers will be used throughout the drawings to refer to the same or like parts.

Figure 12:
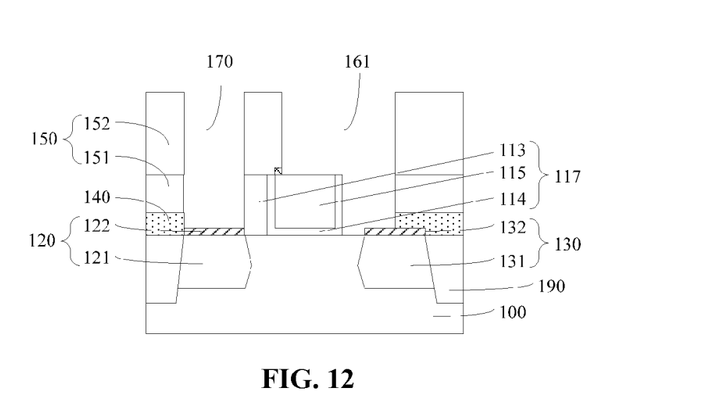
Figure 13:
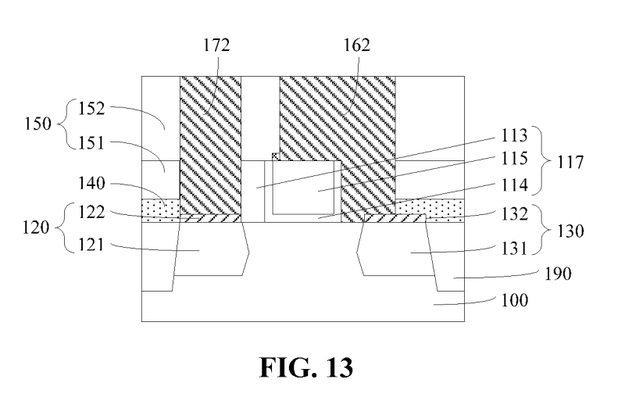
Figure 14:
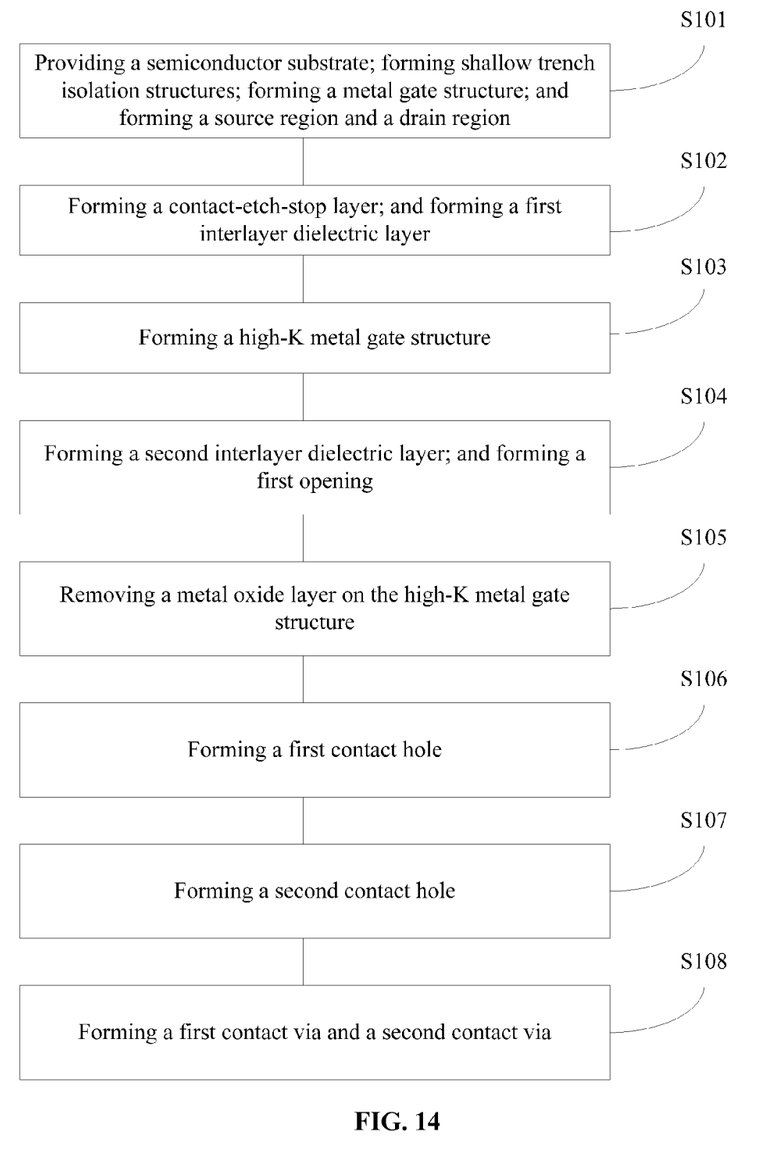
FIG. 14 illustrates an exemplary fabrication process of an MOS transistor with a shared via structure consistent with the disclosed embodiments.

FIG. 14 illustrates an exemplary fabrication process of an MOS transistor with a shared conductive via structure; and FIGS. 6-13 illustrate exemplary semiconductor structures corresponding to various stages of the fabrication process.

Figure 6:
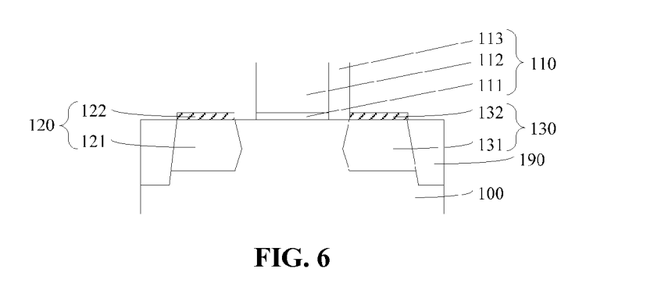
FIGS. 6~13 illustrate semiconductor structures corresponding to certain stages of an exemplary fabrication process of an MOS transistor with a shared via structure consistent with the disclosed embodiments.

As shown in FIG. 14, at the beginning of the fabrication process, a semiconductor substrate with certain structures is provided (S101). FIG. 6 illustrates a corresponding semiconductor structure.

As shown in FIG. 6, a semiconductor substrate 100 is provided. The semiconductor substrate 100 may include any appropriate semiconductor materials, such as silicon, silicon on insulator (SOI), silicon germanium, carborundum, indium antimonide, lead telluride, indium arsenide, indium phosphide, gallium arsenidie, gallium antimonite, or ally semiconductor, etc. In one embodiment, the semiconductor substrate 100 is silicon. The semiconductor substrate may provide a base for subsequent structures and processes.

After providing the semiconductor substrate 100, shallow trench isolation (STI) structures 190 may be formed in the semiconductor substrate 100; and a gate structure 110 may be formed on the semiconductor substrate 100. As shown in FIG. 6, the gate structure 110 may include a dielectric layer 111 on one surface of the semiconductor substrate 100; a gate 112 on the surface of the gate dielectric layer 111; and a sidewall spacer 113 on the sidewalls of the gate dielectric layer 111 and the gate 112.

The STI structures 190 may be formed by any appropriate process. The gate structure 110 may be formed by a gate first process, or a gate last process. In one embodiment, the gate structure 110 is formed by a gate last process.

The gate dielectric layer 111 may be made of any appropriate material, such as silicon oxide, or high-K dielectric material including one or more of $HfO_2$, $Al_2O_3$, $ZrO_2$, HfSiO, HfSiON, HfTaO, or HfZrO, etc.

The gate 112 may be made of any appropriate material, such as poly silicon, or other conductive material including one or more of W, Al, Cu, Ti, Ta, TaN, NiSi, CoSi, TiN, TiAl or TaSiN, etc. In one embodiment, the gate 112 is poly silicon. For illustrative purposes, a poly silicon gate structure 110 may be referred to the gate structure 110

The sidewall spacer 113 may be made of any appropriate material, such as silicon oxide, silicon nitride, or silicon oxynitride, etc. The sidewall spacer 113 may also be a stacked layer made of two or more different materials. In one embodiment, the sidewall spacer 113 may be made of a material same as a subsequently formed contact-hole-etch-stop layer, thus a subsequent process for removing the contact-hole-etch-stop layer may also remove a portion of the sidewall spacer 113 to expose a portion of the semiconductor substrate 100 under the portion of the sidewall spacer 113.

The poly silicon gate structure 110 may be formed sequentially by forming a gate dielectric material layer on the semiconductor substrate 100 and a gate material layer on the gate dielectric material layer; etching the gate material layer and the gate dielectric material; forming a sidewall spacer material layer on the surface of the gate dielectric layer 111, the gate layer 112 and the surface of the semiconductor substrate 100; followed by an etch back process. The gate material layer, the gate dielectric material layer and the sidewall spacer material layer may be formed by various processes, such as a chemical vapor deposition (CVD) process, a physical vapor deposition (PVD) process, or an atomic layer deposition (ALD) process, etc. A process for etching the gate dielectric material layer and the gate material layer and the etch back process may be a plasma etching process, an ion beam etching process, or a wet chemical etching process, etc.

Further, referring to FIG. 6, a source region 120 and a drain region 130 may be formed in the semiconductor substrate 100 at both sides of the poly silicon gate structure 110. The source region 120 may include a first doping region 121 and a first metal silicide layer 122. The drain region 130 may include a second doping region 131 and a second metal silicide layer 132.

A process for forming the source region 120 and the drain region 130 may include forming trenches in the semiconductor substrate 100 at both sides of the poly silicon gate structure 110; filling the trenches with stress material; forming the first doping region 121 and the second doping region 131 by performing an ion implantation process to the stress material; and forming the first metal silicide layer 122 on the first doping region 121 and the second metal silicide layer 132 on the second doping region 131. Such a process may be referred as an embedding process. In certain other embodiment, the first doping region 121 and the second doping region 131 may be directly formed by an ion implantation process, followed by forming the first metal silicide layer 122 on the first doping region 121 and the second metal silicide layer 132 on the second doping region 131. In certain other embodiments, the source region 120 may only have the first doping region 121; and the drain region 130 may also only have the first doping region 121.

The stress material may be made of any appropriate material, such as germanium, or silicon germanium, etc. The stress material may be doped by any appropriate type of ions, such as P-type ions, or N-type ions, etc. The first metal silicide layer 122 and the second metal silicide layer 132 may made of any appropriate metal silicide, such as nickel silicide, cobalt silicide, nickel cobalt silicide, or tungsten silicide, etc. In one embodiment, the metal silicide is nickel silicide (SiCoNi).

The drain region 130 and the poly silicon gate structure 110 may share a same conductive via, thus a total width of the drain region 130 and the poly silicon gate structure 110 may be smaller than a total width of the drain region 130 and the poly silicon gate structure 110 if having two separated conductive vias. Thus, a device integration degree may be increased. In one embodiment, the width of the drain region 130 may be smaller than the width of the source region 120.

Figure 7:
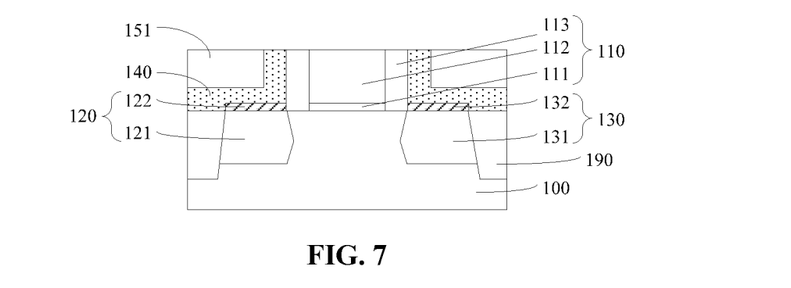

Returning to FIG. 14, after providing the semiconductor substrate 100 with the poly silicon gate structure 110, the source region 120 and the drain region 130, a contact-etch-stop layer (CESL) may be formed on the source region 120 and the drain region 130; and a first interlayer dielectric layer may be formed on the CESL (S102). FIG. 7 illustrates a corresponding semiconductor structure.

As shown in FIG. 7, a contact-etch-stop layer (CESL) 140 is formed on the source region 120 and the drain region 130. A first interlayer dielectric layer 151 is formed on the CESL 140.

A process for forming the CESL 140 and the first interlayer dielectric layer 151 may include forming a contact-etch-stop material layer on the source region 120, the drain region 130 and the poly silicon gate structure 110; forming a first interlayer dielectric material layer on the contact-etch-stop material layer; and polishing the first interlayer dielectric material layer and the contact-etch-stop material layer until the top of the poly silicon gate structure 110 is exposed. That is, the top surface of the first interlayer dielectric layer 151 levels with the top surface of the poly silicon gate structure 110.

The CESL 140 may be made of any appropriate material, such as silicon oxide, silicon nitride or silicon oxynitride, etc. By using the CESL 140, a subsequent process for forming a contact hole by a CESL etching process may just cause the bottom of the contact hole to expose the surface of the source region 120, and/or the surface of the drain region 130, an over-etching of the source region 120 and the drain region 130 may be prevented. Various processes may be used to form the CESL 140, such as a CVD process, a PVD process, or an ALD process, etc.

The first interlayer dielectric layer 151 may be made of any appropriate material, such as silicon oxide, silicon nitride, or low-K materials. The low-K material may refer to a material with a dielectric constant lower than 3.9. The low-K material may be used to lower the RC (resistor and compositor) delay of the interconnection structure of an IC.

Figure 8:
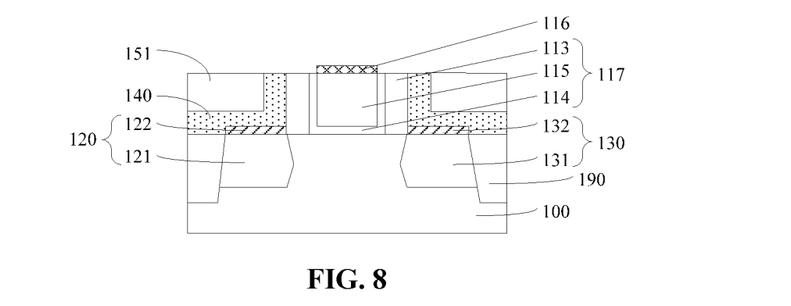

Returning to FIG. 14, after forming the CESL 140 and the first interlayer dielectric layer 151, a first grove may be formed by removing the poly silicon gate 112 and the gate dielectric layer 111, and a high-K dielectric layer and a metal gate may be formed in the first grove (S103). FIG. 8 illustrates a corresponding semiconductor structure.

As shown in FIG. 8, a high-K dielectric layer 114 is formed on the inner sidewall of the sidewall spacer 113 and the surface of the semiconductor substrate 100; and a metal gate 115 is formed on the high-K dielectric layer 114. The position of the high-K dielectric layer 114 and the metal gate 115 is the first grove (not shown) formed by removing the gate dielectric layer 111 and the poly silicon gate 112 shown in FIG. 7. The high-K dielectric layer 114, the metal gate 155 and the sidewall spacer 113 together may form a metal gate structure 117. The metal gate structure 117 may also be referred as a high-K metal gate (HKMG) structure.

A dielectric constant of the material used for the high-K dielectric layer 114 may be greater than approximately 3.9. Thus, the high-K dielectric layer 114 may be made of one or more of $HfO_2$, $ZrO_2$, HfSiNO, $Al_2O_3$, and SBO, etc. The high-K dielectric layer 144 may be formed by any appropriate process, such as a CVD process, a PVD process, or an ALD process, etc.

In one embodiment, a work function layer (not shown) may be formed between the high-K dielectric layer and the metal gate 115. The work function layer may be used to adjust the work function of the high-K metal gate structure 117. Various materials may be used as the work function layer, such as Ti, TiN, Ta, or TaN, etc.

The metal gate 115 may be made of any appropriate material, such as Al, Cu, or Ag, etc. Various methods may be used to form the metal gate 115, such as a CVD process, a PVD process, or an electroplating process, etc.

In one embodiment, the metal gate 115 is made of Al. The top of the Al metal gate 115 may expose to oxygen, an $Al_2O_3$ layer 116, as shown in FIG. 8, may be formed on the top of the Al metal gate 115 by a chemical reaction of the Al and O. Because $Al_2O_3$ is an electrical isolation layer, if a first conductive via is directly formed on the metal gate 114 having the $Al_2O_3$ layer 116, an electrical connection between the first conductive via and the HKMG 117 may be significantly affected. That is, the conductivity between the first conductive via and the HKMG structure 117 may be significantly reduced. Therefore, before forming the first conductive via, the $Al_2O_3$ layer 116 may need to be removed.

In certain other embodiments, if the metal gate 115 is made of Cu, CuO layer may also be formed on the top of the metal gate 115. The CuO layer may also need to be removed before forming the first conductive via to avoid a conductivity reduction.

In certain other embodiment, if the gate dielectric layer 111 shown in FIG. 7 is made of a high-K material, the gate dielectric layer 111 may need not be removed, the metal gate 115 may be directly formed on the gate dielectric layer 111 in the first grove formed by the removing the poly silicon gate 112. Thus, the HKMG structure 117 may be formed.

Figure 9:
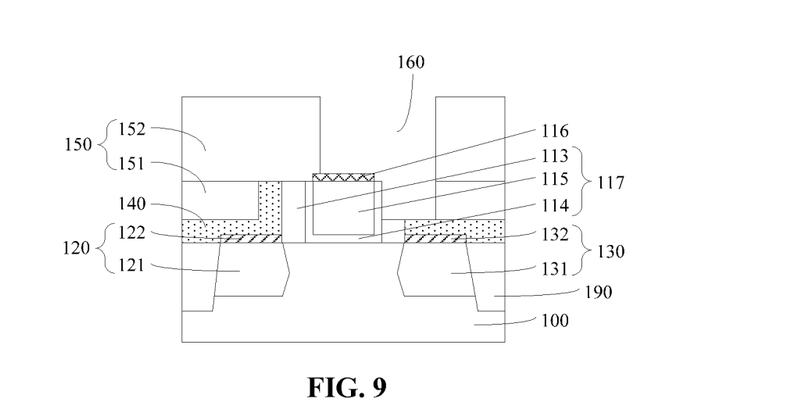

Returning to FIG. 14, after forming the HKMG structure 117 with the oxide layer 116, a second interlayer dielectric layer may be formed on the first interlayer dielectric layer 151 and the HKMG structure 117 with the oxide layer 116, and forming a first opening in the first interlayer dielectric layer 151 and the second interlayer dielectric layer (S104). FIG. 9 illustrates a corresponding semiconductor structure.

As shown in FIG. 9, a second interlayer dielectric layer 152 is formed on the first interlayer dielectric layer 151 and the HKMG structure 117 with the oxide layer 116. Further, a first opening 160 is formed in the first interlayer dielectric layer 151 and the second interlayer dielectric layer 152.

The second interlayer dielectric layer 152 may be made of a material same as the first interlayer dielectric layer 151, such as silicon oxide, silicon nitride, or silicon oxynitride, etc. The second interlayer dielectric layer 152 may also be formed by a material different than the first interlayer dielectric layer 151. In one embodiment, the first interlayer dielectric layer 151 and the second interlayer dielectric layer 152 are made of a same material. Therefore, for illustrative purposes, an interlayer dielectric layer 150 is used to refer to the first interlayer dielectric layer 151 and the second interlayer dielectric layer 152.

Referring to FIG. 9, the first opening 160 is formed in the interlayer dielectric layer 150. A position of the first opening 160 may be a position of a subsequently formed first conductive via. The first conductive via may electrically connect with both the HKMG structure 117 and the drain region 130, and a shared conductive via may be formed. Further, the first conductive via may span over the HKMG structure 117 and the drain region 130, thus it may only need a total width of the HKMG structure 117 and the drain region 130 to be greater than a diameter of the first conductive via to ensure the conductivity of the shared conductive via, i.e., electrically connect with both the HKMG structure 117 and the drain region 130. Thus, the total width of the HKMG structure 117 and the drain region 130 is not necessarily limited by the diameter of the first conductive via, and the total width of the HKMG structure 117 and the drain region 130 may be significantly small. Therefore, the device integration degree may be improved.

Further, referring to FIG. 9, the first opening 160 may expose a portion of the top surface of the HKMG structure 160 and a portion of the surface of the drain region 130. In certain other embodiments, the first opening 160 may expose the entire top surface of the HKMG structure 117 and the surface of the drain region 130. That is, the total width of the HKMG structure 160 and the surface of the drain region 130 may be equal to a diameter of the subsequently formed conductive via.

Referring to FIG. 9, the first opening 160 may be formed by etching the interlayer dielectric layer 150 until the surface of the CESL 140 on the drain region 130 is exposed. That is, the second metal silicide layer 132 may still be covered by remaining CESL 140. A portion of the sidewall spacer 113 may be kept, and the high-K gate dielectric layer 114 may be kept as well. Various etching processes may be used to etch the interlayer dielectric layer 150, such as a dry etching process, or a wet etching process, etc. The first opening 160 may be used to subsequently form a shared conductive via, thus the etching process may also be refereed as a share contact etch with CESL remained at bottom of the first opening 160.

In one embodiment, after the etching process for forming the first opening 160 and before an argon sputtering process for removing the oxide layer 116, a thickness of the remaining CESL 140 on the sidewall spacer 113 (may also be the thickness of the CESL 140 on the second metal silicide layer 132) and a height of the remaining sidewall spacer 113 may be in a range of approximately 50 Å~300 Å. A thickness of the CESL 140 on the drain region 130 may be equal to, or greater than 90% of a total thickness of the CESL 140. That is, the exposed surface of the CESL 140 may be equal to, or slightly lower than the surface of the CESL 140 under the first interlayer dielectric layer 151. "A height of the portion of the sidewall spacer and the contact-etch-stop layer left on the bottom of the first opening after removing the metal oxide layer may be greater than approximately 25% of a total height of the metal gate structure". In certain other embodiments, the thickness of the remaining CESL 140 on the drain region 130 may also be other appropriate values.

The remaining sidewall spacer 113 and the remaining CESL 140 may still exist after a subsequent process for removing the $Al_2O_3$ layer 116, thus the semiconductor substrate 110 is not exposed, and depressions may unlikely be formed on the semiconductor substrate 100. Therefore, the leakage current of a subsequently formed MOS transistor may be relatively low.

Figure 10:
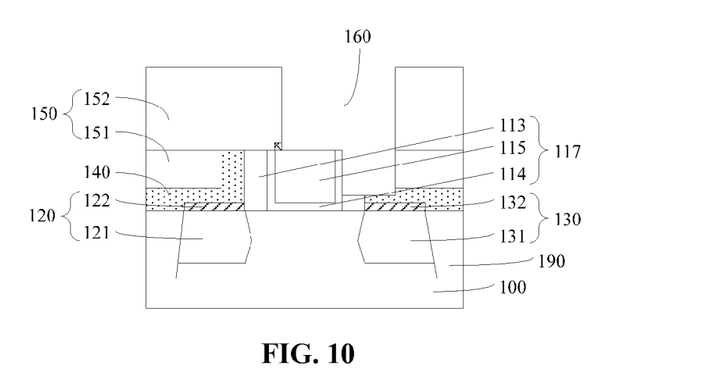

Returning to FIG. 14, after forming the first opening 160, the metal oxide layer 116 may be removed with the semiconductor substrate 100 being kept intact (S105). FIG. 10 illustrates a corresponding semiconductor structure.

As shown in FIG. 10, the metal oxide layer 116 on the HKMG structure 117 is removed with the semiconductor substrate 100 still being covered by the remaining sidewall spacer 113 and the remaining CESL 140. Various processes may be used to remove the metal oxide layer 116 such as a dry etching process, an ion sputter process, or a wet etching process, etc.

In one embodiment, the metal oxide layer 116 is $Al_2O_3$; and an ion sputter process may be used to remove the $Al_2O_3$ layer 116. Argon gas may be used in the ion sputter process. Argon may be ionized by a radio frequency power source, then the top surface of the HKMG structure 117 may be sputtered by the argon ions when a bias voltage is applied. Parameters of the argon ion sputter process may be adjusted by varying the power of the radio frequency power source, the power of the bias power source, a flow of argon and the sputter time, etc.

Because of the existence of the remaining sidewall spacer 113 and the remaining CESL 140, after the argon sputter process for removing the metal oxide layer 116, there may be still left sidewall spacer 113 and CESL 140 covering on the semiconductor substrate 100, thus depressions may unlikely be formed on the semiconductor substrate 100.

Optionally, before removing the metal oxide layer 116, the semiconductor substrate 100 with the formed structures may be cleaned by a wet chemical method, or a plasma ashing process, etc.

Figure 11:
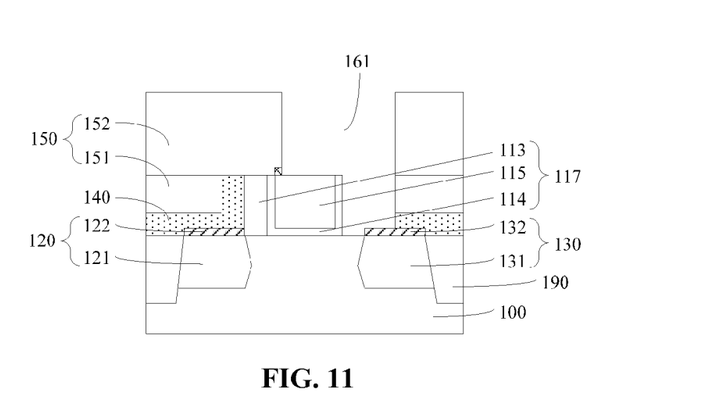

Returning to FIG. 14, after removing the metal oxide layer 116, a first contact hole may be formed by removing the remaining sidewall spacer 113 and the remaining CESL 140 on the bottom of the first opening 160 (S106). FIG. 11 illustrates a corresponding semiconductor structure.

As shown in FIG. 11, a first contact hole 161 is formed in the interlayer dielectric layer 150. The first contact hole 161 may be formed by removing the remaining sidewall spacer 113 and the remaining CESL 140 on the bottom of the first opening 160 shown in FIG. 10.

Various processes may be used to remove the remaining sidewall spacer 113 and the CESL 140, such as a dry etching process, a wet etching process, or an ion beam etching process, etc. In one embodiment, a dry etching process may be used to remove the remaining sidewall spacer 113 and the remaining CESL 140.

By properly selecting the dry etching process (may be referred as a dry chemical pre-cleaning process), a significantly high etching selectivity ratio may be obtained, and the semiconductor substrate 100 may unlikely be etched when the remaining sidewall spacer 113 and the remaining CESL 140 are removed; depressions is also unlikely formed on the semiconductor substrate 100 on the bottom of the contact hole 161.

In one embodiment, if the CESL 140 is made of SiCoNi, the dry etching process may be a SiCoNi pre-cleaning process. The SiCoNi pre-cleaning process may include a $NF_3$/$NH_3$ dry etching process and an in situ annealing process. $NF_3$/$NH_3$ may be converted into $NH_4F$ and $NH_4F.HF$ by a plasma process. $NH_4F$ and $NH_4F.HF$ may react with the CESL 140 on the bottom of the first opening 160, and silicate may formed. Then, the silicate may be converted into gases during the in situ annealing process; and the CESL 140 on the bottom of the first opening 160 may be removed.

By adjusting the ratio of $NF_3$ and $NH_3$, an etching selectivity ratio of silicon oxide and silicon nitride may be correspondingly adjusted. For example, increasing the ratio of $NF_3$ may increase the etching rate of silicon oxide, but the etching rate of silicon nitride may barely change. Increasing the ratio of $NH_3$ may slightly decrease the etching rate of silicon oxide, but the etching rate of silicon nitride may be significantly reduced. Further, $NH_4F$ and $NH_4F.HF$ may unlikely react with the semiconductor substrate material, such as Si, Ge, or SiGe, etc., thus depressions may unlikely be formed on the semiconductor substrate 100; and a subsequently formed MOS transistor may have a relatively low leakage current.

During the $NF_3$/$NH_3$ dry etching process, a temperature of the wafer stage may be in a range of approximately 30° C.~40° C. A pressure of the reaction chamber may be in a range of approximately 1 Torr~10 Torr. A power of the radio frequency power source may be in a range of approximately 10 W~100 W. A flow of $NF_3$ may be in a range of approximately 10 sccm~500 sccm. A flow of the $NH_3$ may be in a range of approximately 10 sccm~500 sccm. Further, a temperature of the in situ annealing process may be greater than approximately 70° C.

Returning to FIG. 14, after forming the first contact hole 161, a second contact hole 170 may be formed (S107). FIG. 12 illustrates a corresponding semiconductor structure.

As shown in FIG. 12, a second contact hole 170 is formed in the interlayer dielectric layer 150. The second contact hole 170 may be formed by etching the interlayer dielectric layer 150 until the surface of the CESL 140 is exposed. The second contact hole 170 may be used to subsequently form a second conductive via.

The second contact hole 170 may be formed by a same process for forming the first opening 161. The second contact hole 170 may also be formed by a separated process. Various processes may be used to form the second contact hole 170, such as a dry etching process, a wet etching process, or an ion beam etching process, etc.

Returning to FIG. 14, after forming the second contact hole 170, a first contact via may be formed in the first contact hole 161; and a second conductive via may be formed in the second contact hole 170 (S108). FIG. 13 illustrates a corresponding semiconductor structure.

As shown in FIG. 13, a first conductive via 162 is formed in the first contact hole 161; and a second conductive via 171 is formed in the second contact hole 170. The first contact via may connect both the HKMG structure 117 and the drain region 130, thus the first contact via 162 may be referred as shared contact via.

The first conductive via 162 and the second conductive via 172 may be formed simultaneously. The first conductive via 162 may also be formed by independent processes. In one embodiment, the first conductive via 162 and the second conductive via 172 are formed simultaneously. Referring to FIG. 13, a process for forming the first conductive via 162 and the second conductive via 172 may include forming a diffusion barrier layer (not shown) on the sidewalls and the bottoms of the first contact hole 161 and the second contact hole 170 and the interlay dielectric layer 150; forming a second metal material layer (not shown) on the diffusion barrier layer; and performing a chemical mechanical polishing process onto the diffusion barrier layer and the second metal material layer until the top surface of the interlayer dielectric layer 150 is exposed. Thus, the first conductive via 162 is formed in the first contact hole 161; and the second conductive via 172 is formed in the second contact hole 170.

The diffusion barrier layer may be used to prevent the second metal material layer from diffusing into the interlayer dielectric layer 150. The diffusion barrier layer may be made of any appropriate material, such as Ti, TiN, Ta, or TaN, etc. The second metal material layer may be made of any appropriate metal, such as Cu, Al, or W, etc.

The diffusion barrier layer may be formed by any appropriate process, such as a CVD process, a PVD process, an ALD process, or a flowable CVD process, etc. Various processes may be used to form the second metal material layer, such as a CVD process, a PVD process, or an electroplating process, etc.

In order to prevent a new oxide layer from being formed on the HKMG structure 117 after removing the metal oxide layer 116, apparatuses of the process for removing the metal oxide layer 116, the SiCoNi pre-cleaning process for removing the remaining sidewall spacer 113 and the CESL 140, the process for forming the second contact hole 170 and the process for forming first conductive via 162 and the second conductive via 172 may be connected with sealed chambers. When unfinished wafers are transferred from one apparatus to another apparatus through the sealed chambers, it may unlikely expose to air, thus a oxidation process may be prevented.

Thus, an MOS transistor may be formed by above disclosed methods and processes, a corresponding MOS transistor is illustrated in FIG. 13. The MOS transistor includes a semiconductor substrate 100, STI structures 190, a source region 120 and a drain region 130 in the semiconductor substrate 100. The MOS transistor also includes a HKMG structure 117 and an interlayer dielectric layer 150 on the semiconductor substrate 100. Further, the MOS transistor includes a first conductive via 162 connecting with both the HKMG structure 117 and the drain region 130 in the interlayer dielectric layer 150, and a second conductive via 172 connecting with source region 120 in the interlayer dielectric layer 150. Further, the MOS transistor also includes a contact-etch-stop layer 140 on the semiconductor substrate 100. The detailed structures and intermediate structures are described above with respect to the fabrication processes.

The above detailed descriptions only illustrate certain exemplary embodiments of the present invention, and are not intended to limit the scope of the present invention. Those skilled in the art can understand the specification as whole and technical features in the various embodiments can be combined into other embodiments understandable to those persons of ordinary skill in the art. Any equivalent or modification thereof, without departing from the spirit and principle of the present invention, falls within the true scope of the present invention.

What is claimed is:

1. A method for fabricating an MOS transistor, comprising:
   providing a semiconductor substrate;
   forming a metal gate structure on the semiconductor substrate, the metal gate structure including a sidewall spacer;
   forming a source region and a drain region in the semiconductor substrate at both sides of the metal gate structure;
   forming a contact-etch-stop layer on the source region, the drain region and the metal gate structure;
   forming an interlayer dielectric layer on the contact-etch-stop layer and the metal gate structure;
   forming a first opening in the interlayer dielectric layer with a portion of the sidewall spacer and the contact-etch-stop layer left on the bottom of the first opening covering the semiconductor substrate and the drain region within the first opening but without exposing the semiconductor substrate and any of the drain region, wherein a height of the portion of the sidewall spacer and the contact-etch-stop layer left on the bottom of the first opening is in a range of approximately 50Å-300Å;
   forming a first contact hole in the interlayer dielectric layer by removing the portion of the sidewall spacer and contact-etch-stop layer left on the bottom of the first opening to expose the semiconductor substrate and the drain region on the bottom of the first opening; and
   forming a first conductive via connecting with the metal gate structure and the drain region in the first contact hole.

2. The method according to claim 1, after forming the first opening, further including:
   removing a metal oxide layer on the metal gate structure while the portion of the sidewall spacer and the contact-etch-stop layer is left on the bottom of the first opening without exposing the semiconductor substrate and any of the source or drain region.

3. The method according to claim 1, after providing the semiconductor substrate, further including:
   forming a plurality of shallow trench isolation structures in the semiconductor substrate.

4. The method according claim 1, wherein forming the first conductive via in the first contact hole further includes:
   forming a diffusion barrier layer on the sidewalls and the bottoms of the first contact hole and the interlayer dielectric layer;
   forming a second metal material layer on the diffusion barrier layer; and
   performing a chemical mechanical polishing process on the diffusion barrier layer and the second metal material layer until a top surface of the interlayer dielectric layer is exposed.

5. The method according to claim 1, wherein forming metal gate structure further includes:
   forming a poly silicon gate structure having a gate dielectric layer, a poly silicon gate and a sidewall spacer on a top surface of the semiconductor substrate;
   forming the contact-etch-stop layer and the interlayer dielectric layer on the semiconductor substrate;
   removing the poly silicon gate and the gate dielectric layer to form a first groove; and
   forming a high-K dielectric layer and a metal gate in the first groove.

6. The method according to claim 1, wherein:
a SiCoNi pre-cleaning process including a dry etching process and an in situ annealing process is used to remove the remaining sidewall spacer and contact-etch-stop layer on the bottom of the first opening.

7. The method according to claim 1, after forming the first contact hole, further including:
forming a second contact hole in the interlayer dielectric layer by etching the interlayer dielectric layer until a top surface of the source region is exposed.

8. The method according to claim 1, wherein forming the first conductive via in the first opening further includes:
forming a second conductive via simultaneously with the first conductive via.

9. The method according to claim 1, wherein:
a thickness of "the portion of the contact-etch-stop layer" left on the surface of the drain region after forming the first opening is equal to or greater than approximately 90% of a thickness of the contact-etch-stop-layer;
a height of the portion of the sidewall spacer and the contact-etch-stop layer left on the bottom of the first opening after removing a metal oxide layer formed on the top of the metal gate structure is greater than approximately 25% of a total height of the metal gate structure; and
a height of the portion of the sidewall spacer and the contact-etch-stop layer left on the bottom of the first contact hole after removing the metal oxide layer is greater than zero.

10. The method according to claim 2, wherein:
the metal oxide layer on the top of the metal gate structure is removed using an argon sputter process.

11. The method according to claim 1, wherein:
a metal oxide layer on the top of the metal gate structure is aluminum oxide or copper oxide.

12. The method according to claim 6, wherein:
a temperature of the in situ annealing process is greater than approximately 70° C.

13. The method according to claim 1, wherein:
the contact-etch-stop layer is made of SiCoNi; and
the first conductive via is made of tungsten.

* * * * *